United States Patent
Ochi

(10) Patent No.: US 7,949,922 B2
(45) Date of Patent: May 24, 2011

(54) TEST APPARATUS, SHIFT AMOUNT MEASURING APPARATUS, SHIFT AMOUNT MEASURING METHOD AND DIAGNOSTIC METHOD

(75) Inventor: Takashi Ochi, Tokyo (JP)

(73) Assignee: Advantest Corporation, Tokyo (JP)

( * ) Notice: Subject to any disclaimer, the term of this patent is extended or adjusted under 35 U.S.C. 154(b) by 987 days.

(21) Appl. No.: 11/774,616

(22) Filed: Jul. 9, 2007

(65) Prior Publication Data

US 2008/0016422 A1 Jan. 17, 2008

(30) Foreign Application Priority Data

Jul. 11, 2006 (JP) .................................. 2006-190387

(51) Int. Cl.
*G01R 35/00* (2006.01)
(52) U.S. Cl. .................... 714/738; 324/617; 714/814
(58) Field of Classification Search .................. 714/738, 714/814; 324/617
See application file for complete search history.

(56) References Cited

U.S. PATENT DOCUMENTS

| | | | | |
|---|---|---|---|---|
| 3,828,249 A * | 8/1974 | Alber et al. | .................... | 324/651 |
| 4,219,770 A * | 8/1980 | Weinert | ........................ | 324/647 |
| 4,497,056 A | 1/1985 | Sugamori | | |
| 4,728,884 A * | 3/1988 | Gumm | ........................ | 324/76.82 |
| 6,046,595 A * | 4/2000 | Wardle | ........................ | 324/615 |
| 6,057,691 A * | 5/2000 | Kobayashi | ........................ | 324/617 |
| 6,064,694 A * | 5/2000 | Clark et al. | .................... | 375/224 |
| 6,369,601 B1 * | 4/2002 | Ishigaki | ................... | 324/762.03 |
| 6,393,372 B1 * | 5/2002 | Rzyski | ........................ | 702/111 |
| 6,928,373 B2 * | 8/2005 | Martens et al. | ................. | 702/65 |

FOREIGN PATENT DOCUMENTS

| EP | 1742074 | 10/2007 |
|---|---|---|
| JP | 2005285160 | 10/2005 |

* cited by examiner

*Primary Examiner* — Stephen M Baker
(74) *Attorney, Agent, or Firm* — Jianq Chyun IP Office

(57) ABSTRACT

A shift amount measuring apparatus for measuring a phase shift amount of a signal under measurement which is input thereto includes a PLL circuit that generates a strobe signal which is synchronized with a reference signal, a CDR circuit that inputs, into the PLL circuit, a control signal which has a level determined in accordance with a difference in phase between the signal under measurement and the strobe signal, so as to achieve a predetermined difference in phase between the signal under measurement and the strobe signal, and a measuring circuit that, before and after the signal under measurement is phase-shifted, measures a value of the control signal when the predetermined difference in phase is achieved between the signal under measurement and the strobe signal, and calculates the phase shift amount of the signal under measurement based on a difference between the measured levels of the control signal.

17 Claims, 6 Drawing Sheets

US 7,949,922 B2

TEST APPARATUS, SHIFT AMOUNT MEASURING APPARATUS, SHIFT AMOUNT MEASURING METHOD AND DIAGNOSTIC METHOD

CROSS REFERENCE TO RELATED APPLICATION

The present application claims priority from a Japanese Patent Application No. 2006-190387 filed on Jul. 11, 2006, the contents of which are incorporated herein by reference.

BACKGROUND

1. Technical Field

The present invention relates to a test apparatus, a shift amount measuring apparatus, a shift amount measuring method and a diagnostic method. More particularly, the present invention relates to a test apparatus for testing a device under test, a shift amount measuring apparatus and a shift amount measuring method for measuring a phase shift amount of a signal under measurement, and a diagnostic method for a test apparatus.

2. Related Art

A test apparatus generates an edge timing by delaying a reference clock, and outputs a test signal the level of which varies at the generated edge timing to a device under test. The test apparatus receives an output signal output from the device under test in response to the test signal, at a timing indicated by a strobe signal, and judges whether the device under test passes or fails the test by comparing the received output signal with an expected value signal. Also, the test apparatus measures an actual phase shift amount of the test signal, for example, at regular time intervals, in order to diagnose whether a PLL or the like provided in the test apparatus is broken. A test apparatus is disclosed which tests a device under test that has a high-speed serial interface of clock-embedded type in, for example, Unexamined Japanese Patent Application Publication No. 2005-285160.

Here, in the conventional art, when measuring the phase shift amount of the test signal, the test apparatus retrieves the test signal at each timing of the strobe signal that is scanned in the temporal direction, to detect the edge timing of the test signal. Scanning the strobe signal in the temporal direction, however, such a conventional test apparatus requires a complex operation.

SUMMARY

In view of the above, an advantage of some embodiments of the present invention is to provide a test apparatus, a shift amount measuring apparatus, and a shift amount measuring method which can solve the above-mentioned problem. This advantage is achieved by combining the features recited in the independent claims. The dependent claims define further effective specific example of the present invention.

To be specific, a first embodiment of the present invention provides a test apparatus for testing a device under test. The test apparatus includes a signal input section that shifts a phase of a test signal in accordance with a designated value of a shift amount supplied thereto, and inputs the phase-shifted test signal to the device under test, a device judging section that evaluates the device under test based on an output signal output from the device under test in response to the input test signal, and a shift amount measuring section that measures a phase shift amount of the test signal output from the signal input section. Here, the shift amount measuring section includes a first loop circuit that generates a synchronization signal which is synchronized with a reference signal, a phase control circuit that inputs, into the first loop circuit, a first control signal which has a value determined in accordance with a difference in phase between the synchronization signal and the test signal, so as to achieve a predetermined difference in phase between the synchronization signal and the test signal, and a measuring circuit that, before and after the test signal is phase-shifted, measures the value of the first control signal when the predetermined difference in phase is achieved between the synchronization signal and the test signal, and detects the phase shift amount of the test signal based on a result of the measurement.

The test apparatus may further include a delay circuit that delays the synchronization signal and inputs the delayed synchronization signal into the phase control circuit, and an offset designating section that calculates an offset delay amount of the test signal based on the value of the first control signal which is measured by the measuring circuit when the designated value of the shift amount is substantially zero, and designates a delay amount of the delay circuit so as to be substantially equal to the calculated offset delay amount. Here, the measuring circuit may detect the phase shift amount of the test signal based on the value of the first control signal which is measured after the test signal is phase-shifted.

The test apparatus may further include a timing comparing section that detects a logical value of the output signal in accordance with each pulse of the synchronization signal, and inputs the detected logical value into the device judging section, a switching section that switches an input into the phase control circuit between the test signal and the output signal, and a switching control section that causes the switching section to select the output signal when the test apparatus tests the device under test, and causes the switching section to select the test signal when the test apparatus diagnoses the test apparatus.

The signal input section may include a second loop circuit that generates a clock signal which is synchronized with the reference signal, a signal generating section that generates the test signal in synchronization with the clock signal, and a phase control section that inputs, into the second loop circuit, a second control signal which has a value determined in accordance with the designated value of the shift amount, to cause the second loop circuit to shift a phase of the clock signal.

The synchronization signal may be a strobe signal. The loop circuits may be phase locked loop (PLL) circuits, and the phase control circuit may be a clock data recovery (CDR) circuit.

The test apparatus may further include a loop judging section that judges whether the first and second loop circuits normally operate, based on a result of comparing the phase shift amount of the test signal which is measured by the shift amount measuring section and the designated value of the shift amount.

A second embodiment of the present invention provides a shift amount measuring apparatus for measuring a phase shift amount of a signal under measurement which is input thereto. The shift amount measuring apparatus includes a loop circuit that generates a synchronization signal which is synchronized with a reference signal, a phase control circuit that inputs, into the loop circuit, a control signal which has a level determined in accordance with a difference in phase between the signal under measurement and the synchronization signal, so as to achieve a predetermined difference in phase between the signal under measurement and the synchronization signal, and a measuring circuit that, before and after the signal under measurement is phase-shifted, measures a value of the control signal when the predetermined difference in phase is achieved between the signal under measurement and the synchronization signal, and calculates the phase shift amount of the signal under measurement based on a difference between the measured levels of the control signal.

A third embodiment of the present invention provides a shift amount measuring method for measuring a phase shift amount of an input signal under measurement. The shift amount measuring method includes generating a synchronization signal which is synchronized with a reference signal by using a loop circuit, inputting, into the loop circuit, a control signal which has a value determined in accordance with a difference in phase between the signal under measurement and the synchronization signal, so as to achieve a predetermined difference in phase between the signal under measurement and the synchronization signal, and measuring the value of the control signal when the predetermined difference in phase is achieved between the signal under measurement and the synchronization signal, before the signal under measurement is phase-shifted, measuring the value of the control signal when the predetermined difference in phase is achieved between the signal under measurement and the synchronization signal, after the signal under measurement is phase-shifted, and calculating the phase shift amount of the signal under measurement based on a difference between the measured values of the control signal.

DESCRIPTION OF EXEMPLARY EMBODIMENTS

Hereinafter, one aspect of the present invention will be described through some embodiments. The embodiments do not limit the invention according to the claims, and all the combinations of the features described in the embodiments are not necessarily essential to means provided by aspects of the invention.

Figure 1:
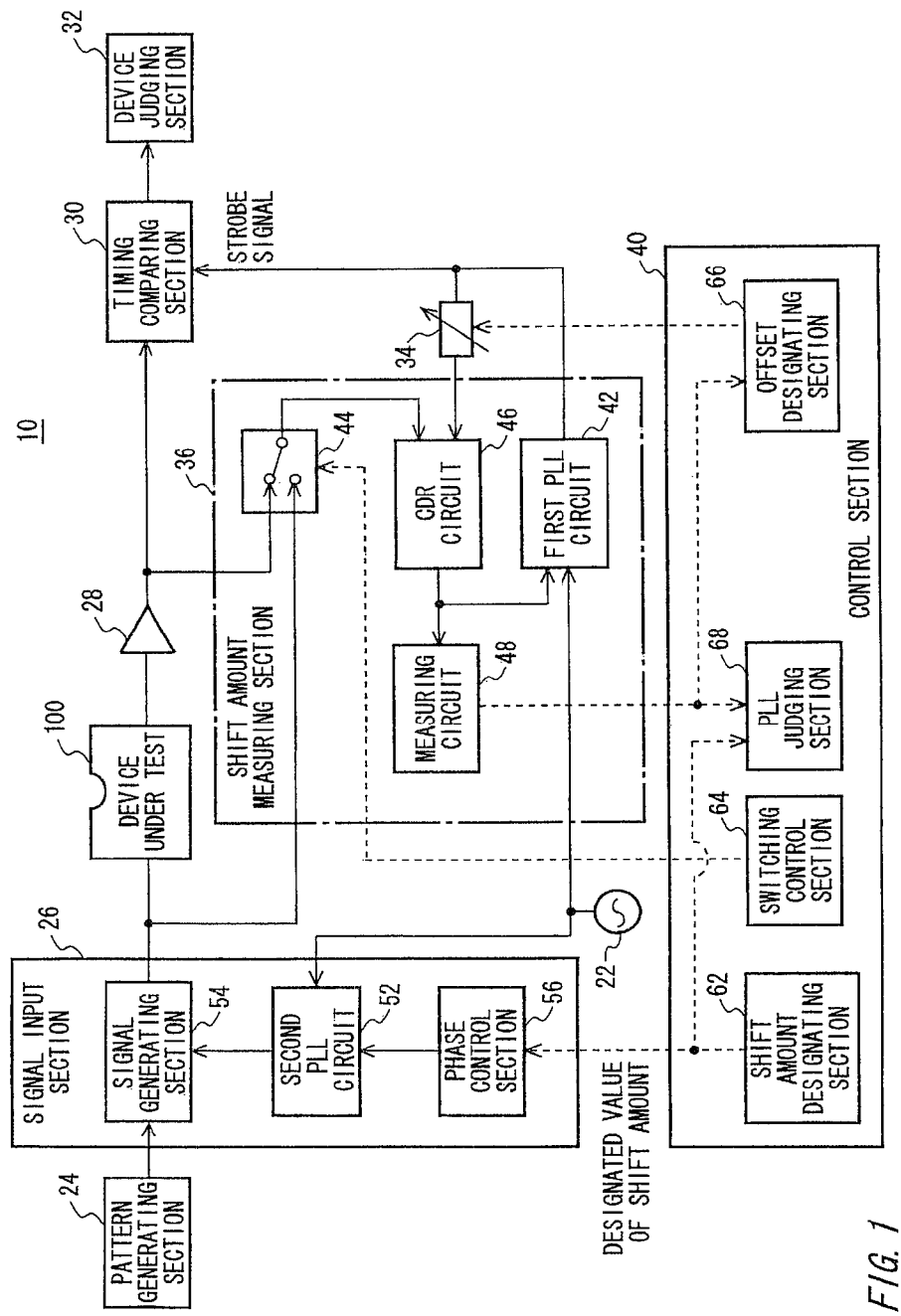
FIG. 1 illustrates the configuration of a test apparatus 10 relating to an embodiment of the present invention, together with a device under test 10.

FIG. 1 illustrates the configuration of a test apparatus 10 relating to an embodiment of the present invention, together with a device under test 10. The test apparatus 10 outputs a test signal to the device under test 100, and judges whether an output signal output from the device under test 100 in response to the test signal passes or fails the test. In this way, the test apparatus 10 tests the device under test 100. In addition, the test apparatus 10 diagnoses the test apparatus 10, for example, at regular time intervals, in order to, for example, diagnose whether a phase locked loop (PLL) or the like provided in the test apparatus 10 is broken. When diagnosing the test apparatus 10, the test apparatus 10 generates the test signal and measures a phase shift amount of the test signal.

The test apparatus 10 includes therein a reference signal generating section 22, a pattern generating section 24, a signal input section 26, a level comparator 28, a timing comparing section 30, a device judging section 32, a variable delay circuit 34, a shift amount measuring section 36, and a control section 40. The reference signal generating section 22 generates a reference signal which is an operating clock of the test apparatus 10. The pattern generating section 24 generates a test pattern. For example, the test pattern specifies a waveform pattern to be supplied to the device under test 100 as the test signal and a timing, in a test cycle, of each edge of the waveform pattern.

The signal input section 26 generates a test signal in accordance with the test pattern generated by the pattern generating section 24, and applies the generated test signal to the device under test 100, when the test apparatus 10 tests the device under test 100. On the other hand, when the test apparatus 10 diagnoses the test apparatus 10, the signal input section 26 inputs, into the device under test 100, a test signal whose phase is shifted in accordance with a designated value of a shift amount supplied thereto. For example, the signal input section 26 may shift the phase of a test signal generated in accordance with a predetermined test pattern, by an amount determined in accordance with the designated value of the shift amount, and apply the phase-shifted test signal to the device under test 100.

For example, the signal input section 26 may include therein a second PLL circuit 52, a signal generating section 54, and a phase control section 56. The second PLL circuit 52 generates a clock signal synchronized with the reference signal generated by the reference signal generating section 22. For example, the second PLL circuit 52 generates a clock signal the phase of which is shifted by an amount determined in accordance with the designated value of the shift amount designated by the phase control section 56 with respect to the phase of the reference signal. For example, the second PLL circuit 52 may generate a clock signal which has a frequency equal to an integral multiple of the frequency of the reference signal.

The signal generating section 54 generates the test signal in synchronization with the clock signal. For example, the signal generating section 54 may generate timings by delaying the clock signal by a delay time indicated by the test pattern, and shape the rising and falling edges of the test signal in accordance with the generated timings. The phase control section 56 inputs, into the second PLL circuit 52, a second control signal having a value determined in accordance with the designated value of the shift amount to cause the second PLL circuit 52 to shift the phase of the clock signal.

Having the above-described configuration, the signal input section 26 can generate a test signal having a waveform in accordance with the test pattern, when the test apparatus 10 tests the device under test 100, and can generate a test signal synchronized with the clock signal whose phase is shifted in accordance with the designated value of the shift amount, when the test apparatus 10 diagnoses the test apparatus 10.

The level comparator 28 digitizes the output signal output from the device under test 100, based on a predetermined threshold level. The timing comparing section 30 detects the logical value of the output signal from the device under test 100, which is output from the level comparator 28, in accordance with each pulse of a strobe signal output from the shift amount measuring section 36 (for example, in accordance with the rising or falling edge of the strobe signal). The timing comparing section 30 then inputs the detected logical value into the device judging section 32. The device judging section 32 judges whether the device under test 100 passes or fails the test, based on the logical value of the output signal which is output by the device under test 100 in response to the test signal. The variable delay circuit 34 delays the strobe signal output from the shift amount measuring section 36 by a designated time period.

The shift amount measuring section 36 outputs a strobe signal which is synchronized with the clock signal included in the output signal output from the device under test 100 and has a predetermined difference in phase with respect to the clock signal, when the test apparatus 10 tests the device under test 100. Note that, when the test apparatus 10 tests the device under test 100, the predetermined difference in phase between the clock signal included in the output signal and the strobe signal corresponds to the delay amount of the variable delay circuit 34. To be specific, when the delay amount of the variable delay circuit 34 is large, the clock signal included in the output signal and the strobe signal has a large difference in phase therebetween. On the other hand, when the delay amount of the variable delay circuit 34 is small, the clock signal included in the output signal and the strobe signal has a small difference in phase therebetween. Therefore, the variable delay circuit 34 can adjust the timing at which the timing comparing section 30 obtains the logical value of the output signal, based on the delay amount thereof.

On the other hand, the shift amount measuring section 36 measures the phase shift amount of the test signal output from the signal input section 26, when the test apparatus 10 diagnoses the test apparatus 10. For example, the shift amount measuring section 36 may measure, as the phase shift amount, a difference in terms of the phase of the test signal between before and after the test signal is phase-shifted. As another example, the shift amount measuring section 36 may measure, as the phase shift amount of a test signal which is generated when the designated value of the shift amount supplied to the signal input section 26 is an arbitrary value, a difference in phase between a test signal which is generated when the designated value of the shift amount supplied to the signal input section 26 is a reference value (for example, the designated value of the shift amount is zero) and the test signal which is generated when the designated value of the shift amount supplied to the signal input section 26 is the arbitrary value. In this case, the shift amount measuring section 36 adjusts the variable delay circuit 34 in advance, so that a first control signal takes a predetermined value (for example, 0) when the test signal which is generated when the designated value of the shift amount is the reference value is input. In this way, the shift amount measuring section 36 may detect the phase shift amount of the test signal, based on the value of the first control signal which is measured after the test signal is phase-shifted.

The shift amount measuring section 36 may include therein a first PLL circuit 42, a switching section 44, a CDR circuit 46 and a measuring circuit 48, for example. The first PLL circuit 42 generates a strobe signal which is synchronized with the reference signal generated by the reference signal generating section 22. To be more specific, the first PLL circuit 42 generates a strobe signal whose phase is shifted by a phase shift amount indicated by the first control signal output from the CDR circuit 46 with respect to the phase of the reference signal. The first PLL circuit 42 may generate a strobe signal having a frequency equal to an integral multiple of the frequency of the reference signal, for example. In this case, the first PLL circuit 42 applies the first control signal output from the CDR circuit 46 to the control voltage of the VCO, in order to generate a strobe signal whose phase is shifted by the phase shift amount with respect to the phase of the reference signal.

The switching section 44 switches the input into the CDR circuit 46 between the test signal and output signal. Specifically speaking, when the test apparatus 10 tests the device under test 100, the switching section 44 supplies the output signal received from the device under test 100 via the level comparator 28, to the CDR circuit 46. On the other hand, when the test apparatus 10 diagnoses the test apparatus 10, the switching section 44 supplies the test signal which is output from the signal input section 26 without going through the device under test 100, to the CDR circuit 46. When the test apparatus 10 diagnoses the test apparatus 10, a substrate in which a short-circuit wiring is formed to directly send, to the CDR circuit 46, the test signal output from the signal input section 26 may be provided in the test apparatus 10, in place of a substrate which has the device under test 100 mounted thereon. In this way, the test apparatus 10 does not require the switching section 44 to send the test signal output from the signal input section 26 directly to the CDR circuit 46.

The CDR circuit 46 detects a difference in phase between the output signal output from the device under test 100 and the strobe signal which is delayed by the variable delay circuit 34, when the test apparatus 10 tests the device under test 100. Also, when the test apparatus 10 tests the device under test 100, the CDR circuit 46 inputs the first control signal whose value is determined in accordance with the detected phase difference into the first PLL circuit 42, and thus controls the phase of the strobe signal so that the output signal and strobe signal have a predetermined phase difference therebetween, which is determined by the variable delay circuit 34. In other words, the CDR circuit 46 generates a first control signal which achieves a phase difference of zero between the output signal and the strobe signal delayed by the variable delay circuit 34. By doing this, the CDR circuit 46 can cause the first PLL circuit 42 to output a strobe signal which is synchronized with the clock signal included in the output signal output from the device under test 100 and has a predetermined phase difference with respect to the clock signal, when the test apparatus 10 tests the device under test 100.

When the test apparatus 10 diagnoses the test apparatus 10, the CDR circuit 46 detects a difference in phase between the strobe signal which is delayed by the variable delay circuit 34 and the test signal which is generated by the signal input section 26. When the test apparatus 10 diagnoses the test apparatus 10, the CDR circuit 46 inputs the first control signal which has a value determined in accordance with the detected phase difference into the first PLL circuit 42, and thus controls the phase of the strobe signal so that the strobe signal and test signal has a predetermined phase difference therebetween. In other words, the CDR circuit 46 generates the first control signal which achieves a phase difference of zero between the test signal and the strobe signal which is delayed by the variable delay circuit 34.

For example, the delay amount of the variable delay circuit 34 may be set so that a phase difference of zero is achieved between the test signal which is generated when the designated value of the shift amount is a reference value (for example, zero) and the strobe signal which is delayed by the variable delay circuit 34, when the test apparatus 10 diagnoses the test apparatus 10. In this way, when the test apparatus 10 diagnoses the test apparatus 10, the CDR circuit 46 can output the first control signal which has a value of substantially zero when receiving the test signal which is generated when the designated value of the shift amount is the reference value (for example, zero). As a result, when the test apparatus 10 diagnoses the test apparatus 10, the CDR circuit 46 can detect the phase shift amount of the test signal whose phase is shifted by an arbitrary amount with respect to the phase of the test signal which is generated when the designated value of the shift amount is the reference value, based on the value of the first control signal.

The measuring circuit 48 measures the value of the first control signal which is adjusted so as to achieve a predetermined phase difference between the strobe signal and test signal, before and after the test signal is phase-shifted, when the test apparatus 10 diagnoses the test apparatus 10. Based on the result of the measurement, the measuring circuit 48 detects the phase shift amount of the test signal. For example, the measuring circuit 48 may detect the phase shift amount of the test signal based on a difference between the values of the first control signal which are measured before and after the test signal is phase-shifted due to a change of the designated value of the shift amount from the reference value (for example, zero) to an arbitrary value. When the delay amount of the variable delay circuit 34 is set so that a phase difference of zero is achieved between the test signal which is generated when the designated value of the shift amount is the reference value (for example, zero) and the strobe signal which is delayed by the variable delay circuit 34, the measuring circuit 48 may detect the phase shift amount of the test signal which is caused by a change of the designated value of the shift amount from the reference value to an arbitrary value, based on the value of the first control signal which is obtained with the test signal which is generated when the designated value of the shift amount is the arbitrary value.

The control section 40 controls the entire test apparatus 10. The control section 40 may include therein a shift amount designating section 62, a switching control section 64, an offset designating section 66, and a PLL judging section 68, for example. The shift amount designating section 62 supplies the designated value of the shift amount for the test signal, to the signal input section 26, when the test apparatus 10 diagnoses the test apparatus 10. The switching control section 64 causes the switching section 44 to select the output signal and to supply the output signal to the CDR circuit 46 when the test apparatus 10 tests the device under test 100, and causes the switching section 44 to select the test signal and to supply the test signal to the CDR circuit 46 when the test apparatus 10 diagnoses the test apparatus 10.

The offset designating section 66 calculates an offset delay amount of the test signal based on the value of the first control signal which is measured by the shift amount measuring section 36 when the designated value of the shift amount is set to substantially zero, and designates the delay amount of the variable delay circuit 34 so as to be substantially equal to the offset delay amount. When the test apparatus 10 diagnoses the test apparatus 10, the offset designating section 66 may designate the delay amount of the variable delay circuit 34 so that a phase difference of zero is achieved between the test signal which is generated when the designated value of the shift amount is the reference value (for example, zero) and the strobe signal which is delayed by the variable delay circuit 34, for example.

The PLL judging section 68 judges whether the first and second PLL circuits 42 and 52 normally operate based on the result of comparing the phase shift amount of the test signal which is measured by the shift amount measuring section 36 and the designated value of the shift amount which is supplied from the shift amount designating section 62 to the signal input section 26. For example, the PLL judging section 68 compares a phase corresponding to the designated value of the shift amount and the measured phase shift amount to each other, and judges whether the difference between these two values falls within a predetermined range. When the difference between the two values falls within the predetermined range, the PLL judging section 68 may judge that the first and second PLL circuits 42 and 52 normally operate. On the other hand, when the difference between the two values does not fall within the predetermined range, the PLL judging section 68 may judge that at least one of the first and second PLL circuits 42 and 52 does not normally operate.

The test apparatus 10 having the above-described configuration can efficiently measure the phase shift amount of the test signal which is generated by the signal input section 26, when diagnosing the test apparatus in order to diagnose whether the first and second PLL circuits 42 and 52 are broken, for example.

It should be noted that the test apparatus 10 may include therein a plurality of reference signal generating sections 22, a plurality of pattern generating sections 24, a plurality of signal input sections 26, a plurality of level comparators 28, a plurality of timing comparing sections 30, a plurality of device judging sections 32, a plurality of variable delay circuits 34, and a plurality of shift amount measuring sections 36, so as to correspond to a plurality of pins of the device under test 100. With such a configuration, the test apparatus 10 can individually diagnose the circuits corresponding to the plurality of pins. In addition, the test apparatus 10 may suspend the use of one or more of the circuits corresponding to one or more of the pins which are judged to be broken in subsequent tests.

Figure 2:
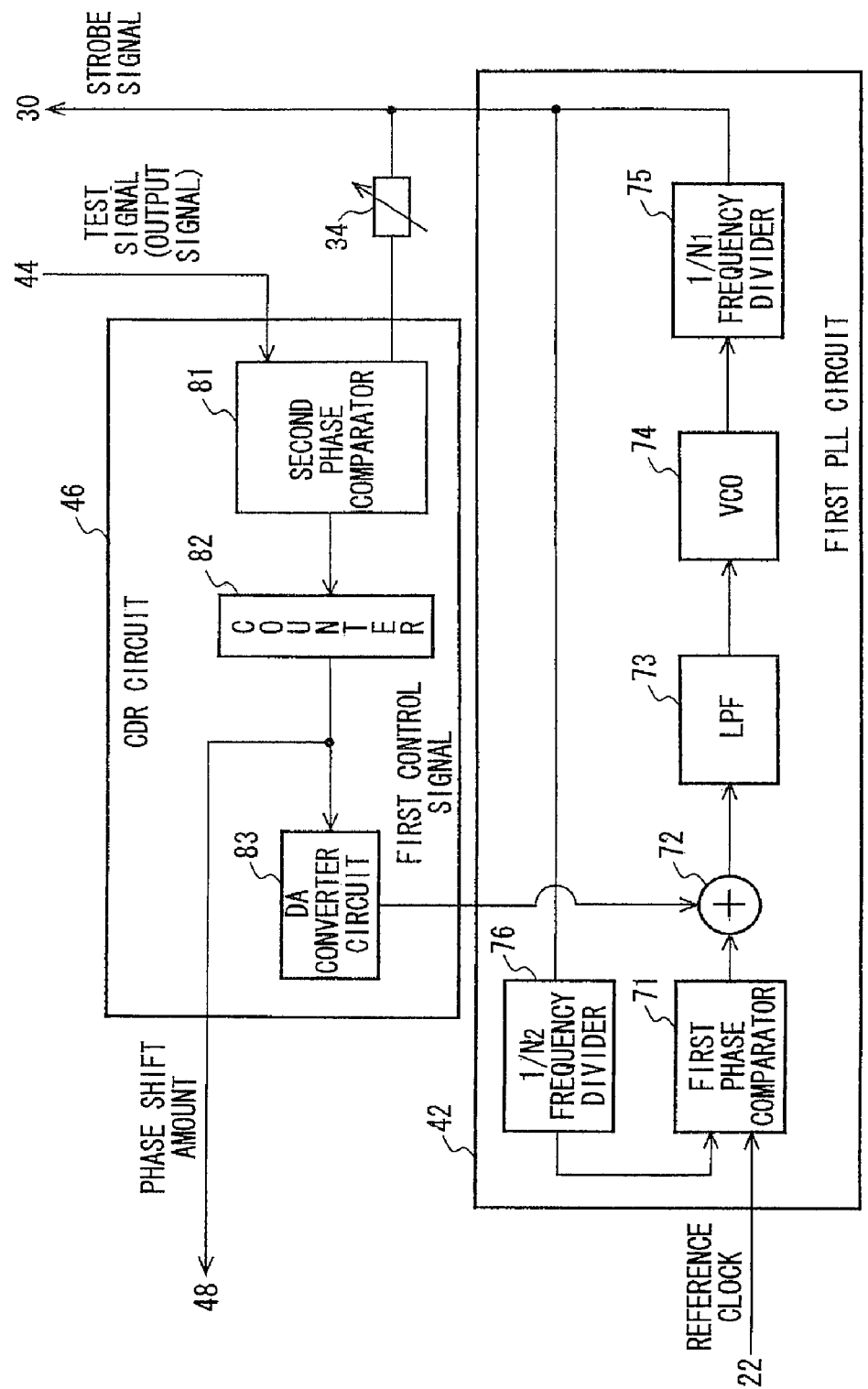
FIG. 2 illustrates exemplary configurations of a first PLL circuit 42 and a CDR circuit 46 relating to an embodiment of the present invention, together with a variable delay circuit 34.

FIG. 2 illustrates exemplary configurations of the first PLL circuit 42 and CDR circuit 46 relating to the present embodiment, together with the variable delay circuit 34. The first PLL circuit 42 may include therein a first phase comparator 71, an adder 72, an LPF 73, a VCO 74, a 1/N1 frequency divider 75, and a 1/N2 frequency divider 76, for example. The first PLL circuit 42 may generate a strobe signal having a frequency equal to an integral multiple of the frequency of the reference signal.

The first phase comparator 71 detects a difference in phase between the reference signal output from the reference signal generating section 22 and a signal output from the 1/N2 frequency divider 76, and outputs a signal having a duty determined in accordance with the detected phase difference. The adder 72 adds the first control signal output from the CDR circuit 46 to the voltage of the output signal from the first phase comparator 71. The LPF 73 outputs a control voltage generated by smoothing the voltage output from the adder 72. The VCO 74 outputs a signal having a frequency determined in accordance with the control voltage output from the LPF 73. The 1/N1 frequency divider 75 divides the frequency of the signal output from the VCO 74 to 1/N1 (N1 is an integer).

The 1/N2 frequency divider 76 divides the frequency of the signal output from the 1/N1 frequency divider 75 to 1/N2 (N2 is an integer). Here, the first PLL circuit 42 outputs the signal output from the 1/N1 frequency divider 75 as the strobe signal. Having the above-described configuration, the first PLL circuit 42 can output a strobe signal whose phase is shifted, with respect to the phase of the reference signal, by an amount determined in accordance with the voltage value output from the CDR circuit 46 and whose frequency is N2 times as high as the frequency of the reference signal.

The CDR circuit 46 may include therein a second phase comparator 81, a counter 82, and a DA converter circuit 83, for example. The second phase comparator 81 detects a difference in phase between the strobe signal which is delayed by the variable delay circuit 34 and the test signal, and outputs a signal having a duty determined in accordance with the detected phase difference. The counter 82 increments or decrements a count value in accordance with the output signal from the second phase comparator 81. For example, the counter 82 increments the count value when the output signal from the second phase comparator 81 indicates a high level, and decrements the count value when the output signal from the second phase comparator 81 indicates a low level. By doing this, the counter 82 can output a digital value corresponding to the phase difference between the strobe signal which is delayed by the variable delay circuit 34 and the test signal. The DA converter circuit 83 outputs the first control signal which has a voltage value determined in accordance with the count value of the counter 82.

Having the above-described configuration, the CDR circuit 46 makes it possible for the first PLL circuit 42 to output the strobe signal whose phase is delayed, with respect to the phase of the reference signal, by an amount determined in accordance with the phase difference between the test signal (output signal) and the strobe signal which is delayed by the variable delay circuit 34. In addition, the above-described CDR circuit 46 can output the count value of the counter 82, as the phase shift amount indicating the phase difference between the test signal (output signal) and the strobe signal which is delayed by the variable delay circuit 34.

Figure 3:
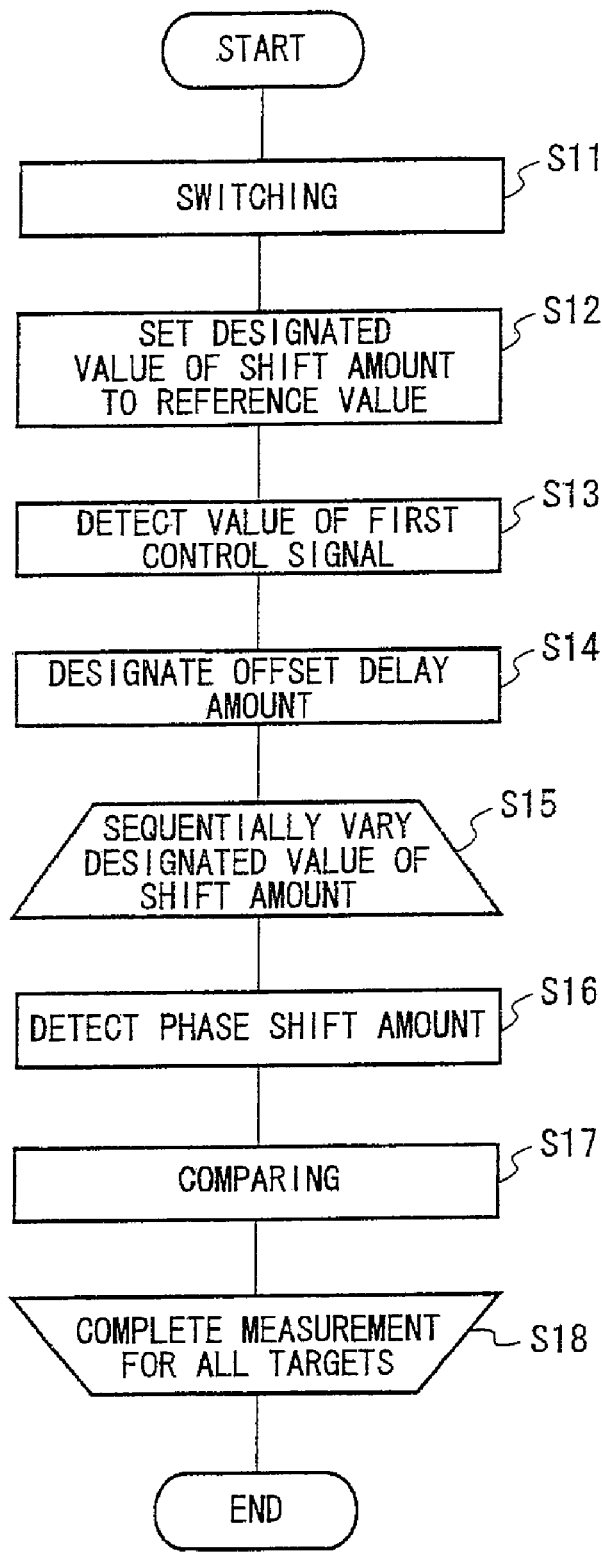
FIG. 3 illustrates an exemplary operation performed to diagnose the test apparatus 10, relating to an embodiment of the present invention.
Figure 4:
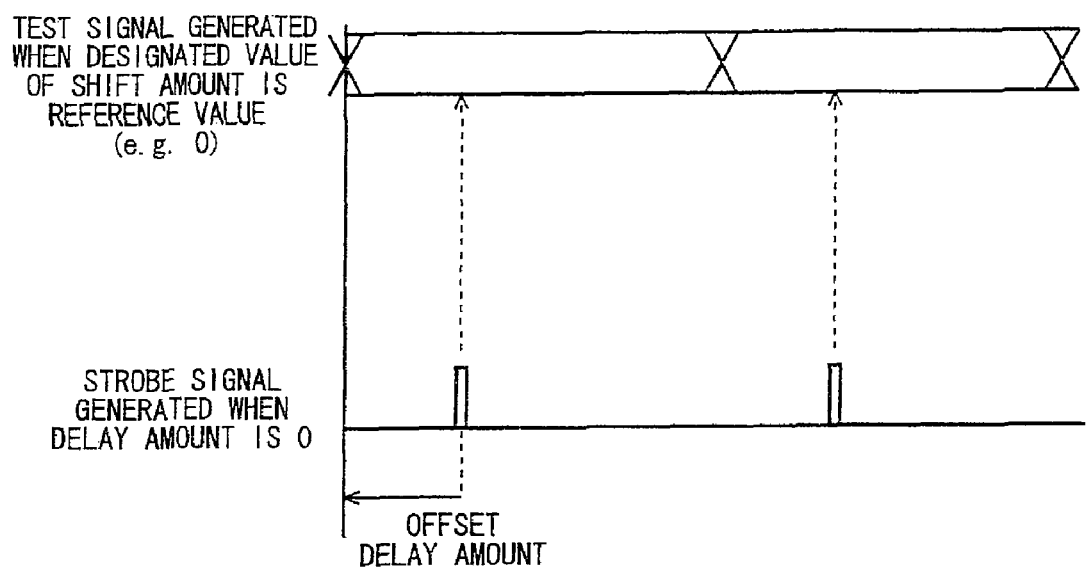
FIG. 4 illustrates an offset delay amount designated in a step S14 in FIG. 3.
Figure 5:
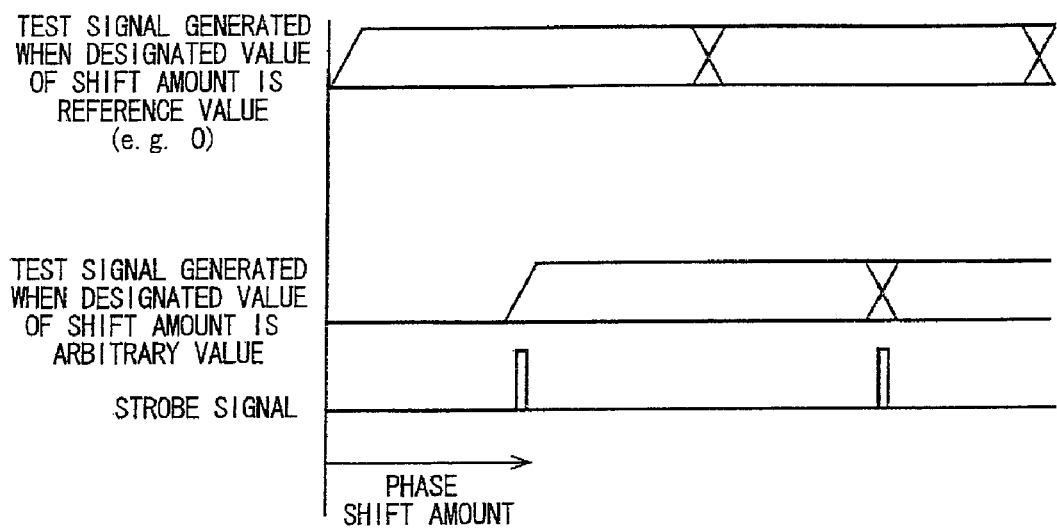
FIG. 5 illustrates a phase shift amount detected in a step S16 in FIG. 3.

FIG. 3 illustrates an exemplary operation performed to diagnose the test apparatus 10, relating to the present embodiment. FIG. 4 illustrates an offset delay amount designated in a step S14 in FIG. 3. FIG. 5 illustrates a phase shift amount detected in a step S16 in FIG. 3.

When the test apparatus 10 starts the diagnosis of the test apparatus 10, the switching control section 64 switches the selection made by the switching section 44 so that the test signal output from the signal input section 26 is supplied to the CDR circuit 46 (step S11). Alternatively, the test apparatus 10 may be provided with a substrate having a short-circuit wiring formed therein to send the test signal output from the signal input section 26 directly to the CDR circuit 46, in place of a substrate having the device under test 100 mounted thereon.

Subsequently, the shift amount designating section 62 sets the designated value of the shift amount for the signal input section 26 at the reference value (for example, zero), and the test signal which has the predetermined pattern is output in each test cycle in a repeated manner (step S12). In this way, the signal input section 26 can output the test signal which has the predetermined pattern and whose delay amount is set to the reference value (for example, zero) in each test cycle in a repeated manner.

Following this, the measuring circuit 48 detects the value of the first control signal, once the phase difference between the test signal and strobe signal takes a predetermined value which is determined by the current delay amount of the variable delay circuit 34 (step S13). The measuring circuit 48 may obtain the first control signal after the operation of the first PLL circuit 42 is stabilized, for example. More specifically, the measuring circuit 48 may detect the value of the first control signal after the variation of the first control signal becomes lower than a predetermined value or after a predetermined time period has elapsed.

Subsequently, the offset designating section 66 designates the delay amount (offset delay amount) of the variable delay circuit 34 based on the value of the first control signal detected in the step S13, so that a phase difference of zero is achieved between the test signal which is generated when the designated value of the shift amount is the reference value (for example, zero) and the strobe signal which is delayed by the variable delay circuit 34 (step S14). In other words, the offset designating section 66 calculates a difference in phase between the test signal which is generated when the designated value of the shift amount is the reference value (for example, zero) and the strobe signal which is generated when the delay amount of the variable delay circuit 34 is set to zero (see FIG. 4), and designates the delay amount (offset delay amount) of the variable delay circuit 34 in accordance with the calculated phase difference.

After this, the shift amount designating section 62 repeatedly performs the operations of steps S16 and S17 by sequentially varying the designated value of the shift amount (steps S15 and S18). In the step S16, the shift amount measuring section 36 detects the value of the first control signal when the phase difference between the test signal and strobe signal takes a predetermined value which is determined by the current delay amount of the variable delay circuit 34. Based on the detected value of the first control signal, the shift amount measuring section 36 measures the phase shift amount of the test signal which is caused by the change of the designated value of the shift amount from the reference value to the current value (see FIG. 5, for example) (step S16).

Subsequently in the step S17, the PLL judging section 68 compares the phase corresponding to the current designated value of the shift amount and the phase shift amount of the test signal which is measured by the shift amount measuring section 36 in the step S16 to each other, and thus judges whether the difference between these two values falls within a predetermined range, for example. When the difference between the two values falls within the predetermined range, the PLL judging section 68 judges that the first and second PLL circuits 42 and 52 normally operate. On the other hand, when the difference between the two values does not fall within the predetermined range, the PLL judging section 68 judges that at least one of the first and second PLL circuits 42 and 52 does not normally operate (step S17).

When the operations of the steps S16 and S17 are completed for all of the designated values of the shift amount designated by the shift amount designating section 62, the diagnosis process ends. By performing the above-described process, the test apparatus 10 sequentially varies the delay amount of the test signal, to judge whether the first and second PLL circuits 42 and 52 normally operate with each delay amount. In the above description, the test apparatus 10 performs the diagnostic process to diagnose whether a PLL or the like provided in the test apparatus 10 is broken, for example. As another example, the test apparatus 10 may measure the phase shift amount to calibrate a PLL or the like.

Figure 6:
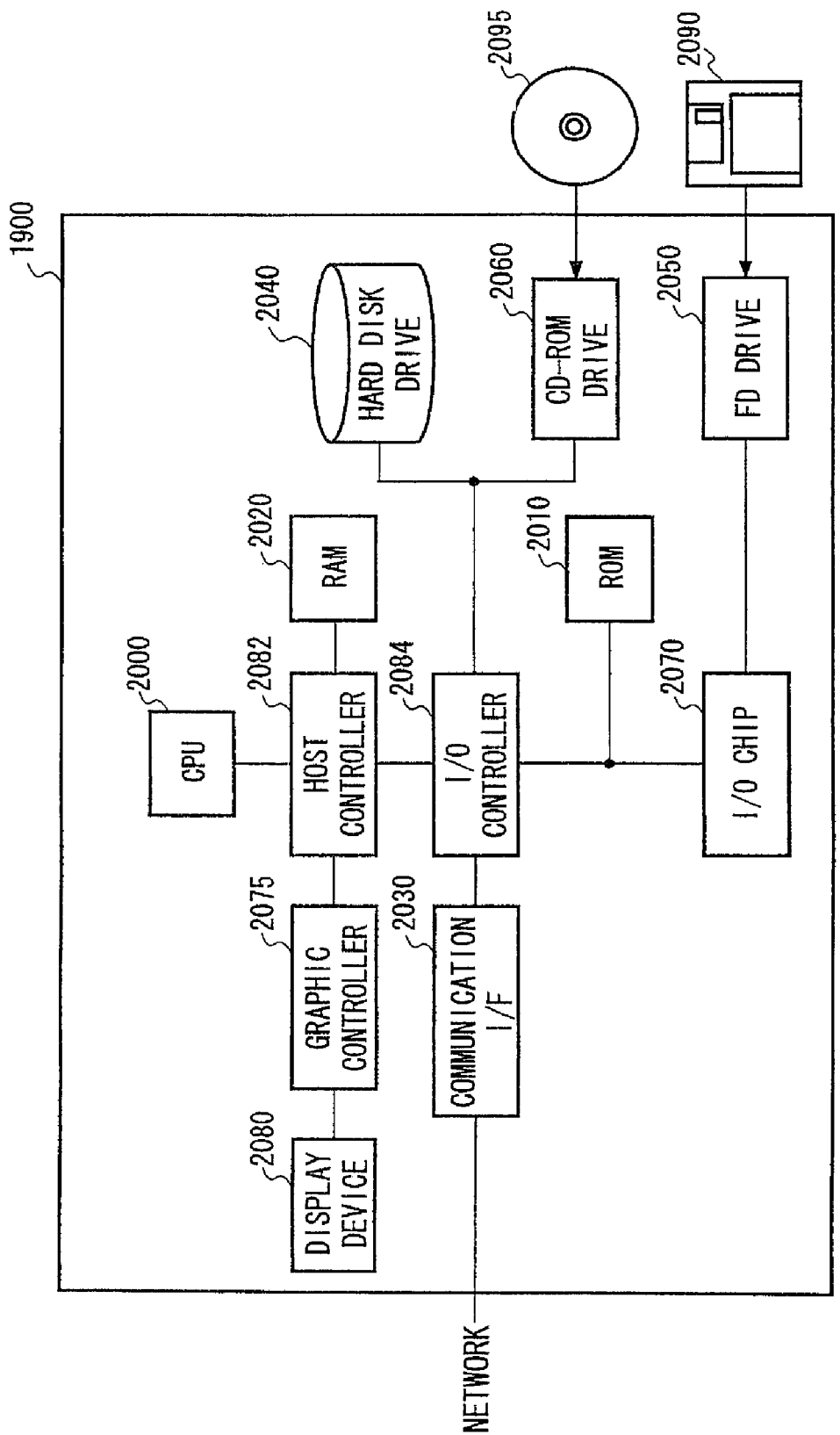
FIG. 6 illustrates an exemplary hardware configuration of a computer 1900 relating to an embodiment of the present invention.

FIG. 6 illustrates an exemplary hardware configuration of a computer 1900 relating to the present embodiment. The computer 1900 relating to the present embodiment is constituted by a CPU surrounding section, an input/output (I/O) section and a legacy I/O section. The CPU surrounding section includes a CPU 2000, a RAM 2020, a graphic controller 2075, and a display device 2080 which are connected to each other by means of a host controller 2082. The I/O section includes a communication interface 2030, a hard disk drive 2040, and a CD-ROM drive 2060 which are connected to the host controller 2082 by means of an I/O controller 2084. The legacy I/O section includes a ROM 2010, a flexible disk drive 2050, and an I/O chip 2070 which are connected to the I/O controller 2084.

The host controller 2082 connects the RAM 2020 with the CPU 2000 and graphic controller 2075 which access the RAM 2020 at a high transfer rate. The CPU 2000 operates in accordance with programs stored on the ROM 2010 and RAM 2020, to control the constituents. The graphic controller 2075 obtains image data which is generated by the CPU 2000 or the like on a frame buffer provided within the RAM 2020, and causes the display device 2080 to display the obtained image data. Alternatively, the graphic controller 2075 may include therein a frame buffer for storing thereon image data generated by the CPU 2000 or the like.

The I/O controller 2084 connects, to the host controller 2082, the communication interface 2030, hard disk drive 2040 and CD-ROM drive 2060 which are I/O devices operating at a relatively high rate. The communication interface 2030 communicates with a difference device via a network. The hard disk drive 2040 stores thereon programs and data to be used by the CPU 2000 provided in the computer 1900. The CD-ROM drive 2060 reads programs or data from a CR-ROM 2095, and supplies the read programs or data to the hard disk drive 2040 via the RAM 2020.

The I/O controller 2084 is also connected to the ROM 2010, flexible disk drive 2050 and I/O chip 2070 which are I/O devices operating at a relatively low rate. The ROM 2010 stores thereon a boot program executed by the computer 1900 at the start up, programs unique to the hardware of the computer 1900, and the like. The flexible disk drive 2050 reads programs or data from a flexible disk 2090, and supplies the read programs or data to the hard disk drive 2040 via the RAM 2020. The I/O chip 2070 is used to connect a variety of I/O devices such as the flexible disk drive 2050 via, for example, a parallel port, a serial port, a keyboard port, a mouse port or the like, A program to be supplied to the hard disk drive 2040 via the RAM 2020 is provided by a user in a state of being stored on a recording medium such as the flexible disk 2090, CD-ROM 2095 and an IC card. The program is read from the recording medium, installed via the RAM 2020 in the hard disk drive 2040 in the computer 1900, and executed by the CPU 2000.

The program to be installed in the computer 1900 so as to cause the computer 1900 to function as the control section 40 of the test apparatus 10 includes a shift amount designating module, a switching control module, an offset designating module and a PLL judging module. The program or modules make a request to the CPU 2000 and the like to cause the computer 1900 to function as the shift amount designating section 62, switching control section 64, offset designating section 66 and PLL judging section 68.

While one aspect of the present invention has been described through the embodiments, the technical scope of the invention is not limited to the above described embodiments. It is apparent to persons skilled in the art that various alternations and improvements can be added to the above-described embodiments. It is also apparent from the scope of the claims that the embodiments added with such alternations or improvements can be included in the technical scope of the invention.

As is apparent from the above description, one embodiment of the present invention makes it possible to efficiently measure the phase shift amount of a test signal or signal under measurement.

What is claimed is:

1. A test apparatus for testing a device under test, comprising:
  a signal input section that shifts a phase of a test signal in accordance with a designated value of a shift amount supplied thereto, and inputs the phase-shifted test signal to the device under test;
  a device judging section that evaluates the device under test based on an output signal output from the device under test in response to the input test signal; and
  a shift amount measuring section that measures a phase shift amount of the test signal output from the signal input section,
  the shift amount measuring section including:
  a first loop circuit that generates a synchronization signal which is synchronized with a reference signal;
  a phase control circuit that inputs, into the first loop circuit, a first control signal which has a value determined in accordance with a difference in phase between the synchronization signal and the test signal, so as to achieve a predetermined difference in phase between the synchronization signal and the test signal; and
  a measuring circuit that, before and after the test signal is phase-shifted, measures the value of the first control signal when the predetermined difference in phase is achieved between the synchronization signal and the test signal, and detects the phase shift amount of the test signal based on a result of the measurement.

2. The test apparatus as set forth in claim 1, further comprising:
  a timing comparing section that detects a logical value of the output signal in accordance with each pulse of the synchronization signal, and inputs the detected logical value into the device judging section;
  a switching section that switches an input into the phase control circuit between the test signal and the output signal; and
  a switching control section that causes the switching section to select the output signal when the test apparatus tests the device under test, and causes the switching section to select the test signal when the test apparatus diagnoses the test apparatus.

3. The test apparatus as set forth in claim 1, wherein the synchronization signal is a strobe signal.

4. The test apparatus as set forth in claim 1, wherein the first and second loop circuits are phase locked loop (PLL) circuits, and the phase control circuit is a clock data recovery (CDR) circuit.

5. The test apparatus as set forth in claim 1, wherein the phase control circuit includes:
  a phase comparator that detects a difference in phase between the synchronization signal and the test signal;
  a counter that is connected to the phase comparator and operates in accordance with an output from the phase comparator; and
  a DA converter circuit that is connected to the counter, and outputs a control signal which has a predetermined voltage determined in accordance with an output from the counter and controls the phase of the synchronization signal.

6. The test apparatus as set forth in claim 1, wherein the first loop circuit includes:
  a low pass filter (LPF);
  a voltage controlled oscillator (VCO) that is connected to the LPF;
  a 1/N1 frequency divider (N1 is an integer) that is connected to the VCO;
  a 1/N2 frequency divider (N2 is an integer) that is connected to the 1/N1 frequency divider; and
  a phase comparator that detects a difference in phase between an output signal from the 1/N2 frequency divider and the reference signal.

7. The test apparatus as set forth in claim 1, further comprising:
  a delay circuit that delays the synchronization signal and inputs the delayed synchronization signal into the phase control circuit; and
  an offset designating section that calculates an offset delay amount of the test signal based on the value of the first control signal which is measured by the measuring circuit when the designated value of the shift amount is substantially zero, and designates a delay amount of the delay circuit so as to be substantially equal to the calculated offset delay amount, wherein
  the measuring circuit detects the phase shift amount of the test signal based on the value of the first control signal which is measured after the test signal is phase-shifted.

8. The test apparatus as set forth in claim 7, wherein the delay circuit is a variable delay circuit.

9. The test apparatus as set forth in claim 1, wherein the signal input section includes:
a second loop circuit that generates a clock signal which is synchronized with the reference signal;
a signal generating section that generates the test signal in synchronization with the clock signal; and
a phase control section that inputs, into the second loop circuit, a second control signal which has a value determined in accordance with the designated value of the shift amount, to cause the second loop circuit to shift a phase of the clock signal.

10. The test apparatus as set forth in claim 9, further comprising
a loop judging section that judges whether the first and second loop circuits normally operate, based on a result of comparing the phase shift amount of the test signal which is measured by the shift amount measuring section and the designated value of the shift amount.

11. A shift amount measuring apparatus for measuring a phase shift amount of a signal under measurement which is input thereto, comprising:
a loop circuit that generates a synchronization signal which is synchronized with a reference signal;
a phase control circuit that inputs, into the loop circuit, a control signal which has a value determined in accordance with a difference in phase between the signal under measurement and the synchronization signal, so as to achieve a predetermined difference in phase between the signal under measurement and the synchronization signal; and
a measuring circuit that, before and after the signal under measurement is phase-shifted, measures the value of the control signal when the predetermined difference in phase is achieved between the signal under measurement and the synchronization signal, and calculates the phase shift amount of the signal under measurement based on a difference between the measured values of the control signal.

12. The shift amount measuring apparatus as set forth in claim 11, wherein
the synchronization signal is a strobe signal.

13. The shift amount measuring apparatus as set forth in claim 11, wherein
the loop circuit is a PLL circuit, and the phase control circuit is a CDR circuit.

14. A shift amount measuring method for measuring a phase shift amount of an input signal under measurement, comprising:
generating a synchronization signal which is synchronized with a reference signal by using a loop circuit;
inputting, into the loop circuit, a control signal which has a value determined in accordance with a difference in phase between the signal under measurement and the synchronization signal, so as to achieve a predetermined difference in phase between the signal under measurement and the synchronization signal; and
measuring the value of the control signal when the predetermined difference in phase is achieved between the signal under measurement and the synchronization signal, before the signal under measurement is phase-shifted;
measuring the value of the control signal when the predetermined difference in phase is achieved between the signal under measurement and the synchronization signal, after the signal under measurement is phase-shifted; and
calculating the phase shift amount of the signal under measurement based on a difference between the measured values of the control signal.

15. The shift amount measuring method as set forth in claim 14, wherein
the synchronization signal is a strobe signal.

16. The shift amount measuring method as set forth in claim 14, wherein
the loop circuit is a PLL circuit.

17. A diagnostic method for a test apparatus including therein (i) a signal input section that shifts a phase of a test signal in accordance with a designated value of a shift amount supplied thereto, and inputs the phase-shifted test signal to a device under test, (ii) a device judging section that evaluates the device under test based on an output signal output from the device under test in response to the input test signal, (iii) a shift amount measuring section that measures a phase shift amount of the test signal output from the signal input section, and (iv) a delay circuit that delays a synchronization signal which is synchronized with a reference signal, and inputs the delayed synchronization signal into the shift amount measuring section, the diagnostic method comprising:
switching a state of the test signal output from the signal input section from a state of being input into the device under test to a state of being input into a phase control circuit;
setting, at a reference value, the designated value of the shift amount for the signal input section, and outputting the test signal which has a predetermined pattern at each test cycle in a repeated manner;
detecting a value of a control signal which controls a phase of the synchronization signal, when a predetermined difference in phase is achieved between the test signal and the synchronization signal, the predetermined difference in phase being determined by a current delay amount of the delay circuit;
designating the delay amount of the delay circuit, based on the detected value of the control signal, so that a phase difference of substantially zero is achieved between the test signal which is generated when the designated value of the shift amount is the reference value and the synchronization signal which is delayed by the delay circuit;
measuring the phase shift amount of the test signal which is caused by a change of the designated value of the shift amount from the reference value to a current value based on the detected value of the control signal;
comparing a phase corresponding to the current designated value of the shift amount and the phase shift amount of the test signal which is measured in the measuring of the phase shift amount, and diagnosing the test apparatus based on a difference between the phase and the measured phase shift amount; and
performing repeatedly the measuring of the phase shift amount and the diagnosing of the test apparatus, by sequentially varying the designated value of the shift amount.

* * * * *